United States Patent
Mclaughlin et al.

(10) Patent No.: US 12,208,291 B2
(45) Date of Patent: Jan. 28, 2025

(54) METHOD AND APPARATUS FOR MAINTAINING AIRFLOW IN A POWERED AIR PURIFYING RESPIRATOR IN HIGH MAGNETIC FIELDS

(71) Applicant: 3M INNOVATIVE PROPERTIES COMPANY, St. Paul, MN (US)

(72) Inventors: Keith K. Mclaughlin, Eagan, MN (US); Douglas D. Jensen, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 827 days.

(21) Appl. No.: 17/309,368

(22) PCT Filed: Dec. 5, 2019

(86) PCT No.: PCT/IB2019/060489
§ 371 (c)(1),
(2) Date: May 21, 2021

(87) PCT Pub. No.: WO2020/115704
PCT Pub. Date: Jun. 11, 2020

(65) Prior Publication Data
US 2022/0001220 A1 Jan. 6, 2022

Related U.S. Application Data (60) Provisional application No. 62/775,951, filed on Dec. 6, 2018.

(51) Int. Cl.
A62B 18/08 (2006.01)
A62B 18/02 (2006.01)
A62B 18/04 (2006.01)
G01R 33/02 (2006.01)

(52) U.S. Cl.
CPC .............. *A62B 18/08* (2013.01); *A62B 18/02* (2013.01); *G01R 33/02* (2013.01); *A62B 18/04* (2013.01)

(58) Field of Classification Search
CPC ......... A62B 18/00; A62B 18/04; A62B 18/08; A62B 18/02; A62B 7/00–10; A62B 18/006; G01R 33/02; G01R 33/072
See application file for complete search history.

(56) References Cited

U.S. PATENT DOCUMENTS

| 6,327,225 B1 | 12/2001 | Okeya | |
|---|---|---|---|
| 2002/0073994 A1* | 6/2002 | Patel | A62B 18/04 128/200.24 |
| 2003/0019494 A1* | 1/2003 | Bennett | A62B 18/006 128/204.14 |

(Continued)

FOREIGN PATENT DOCUMENTS

JP 2013057633 3/2013

OTHER PUBLICATIONS

Supplementary Partial EP Search Report for EP Appl. No. 19894287.2, mailed on Nov. 11, 2022, 3 pp.

(Continued)

*Primary Examiner* — Rachel T Sippel
*Assistant Examiner* — Jacqueline M Pinderski (57) ABSTRACT

The present invention relates to powered air purifying respirators (PAPRs) and methods to overcome issues associated with their use in high magnetic field environments.

15 Claims, 5 Drawing Sheets

(56) References Cited

U.S. PATENT DOCUMENTS

| | | | |
|---|---|---|---|
| 2009/0266361 A1* | 10/2009 | Bilger | A62B 18/006 |
| | | | 128/204.21 |
| 2011/0050216 A1* | 3/2011 | Stone | G01R 33/02 |
| | | | 324/244 |
| 2011/0114093 A1 | 5/2011 | Patil | |
| 2012/0138051 A1 | 6/2012 | Curran | |
| 2013/0087150 A1 | 4/2013 | Palacharla | |
| 2015/0370346 A1* | 12/2015 | Smus | G06F 1/1632 |
| | | | 345/156 |
| 2016/0236014 A1 | 8/2016 | Ehler et al. | |
| 2017/0368381 A1* | 12/2017 | Awiszus | G02F 1/13318 |
| 2019/0160246 A1 | 5/2019 | Saitou et al. | |

OTHER PUBLICATIONS

International Search Report for PCT International Application No. PCT/IB2019/060489, mailed on Mar. 16, 2020, 3 pages.

\* cited by examiner

METHOD AND APPARATUS FOR MAINTAINING AIRFLOW IN A POWERED AIR PURIFYING RESPIRATOR IN HIGH MAGNETIC FIELDS

BACKGROUND

Powered air-purifying respirators (PAPRs) are fan-forced positive pressure respirators used to provide a user of the PAPR with filtered air. PAPRs generally comprise a mask, blower unit, and a power source. A variety of masks may be employed including hoods, partial face masks and others as known to those of skill in the art. The blower unit includes a motor-driven fan for drawing in ambient air. The ambient air is filtered through one or more filters designed to remove any specific contaminant. The filtered air is delivered to the face mask for the user to breath in.

PAPRs are used in a variety of environments that contain airborne contaminants that may be harmful to humans such as, for example, particulates and/or organic gases and vapors. The use of PAPRs is widespread throughout a large variety of environments including, for example, general industry, healthcare, mining, and smelting.

SUMMARY OF THE INVENTION

The present invention relates to powered air purifying respirators and methods for use thereof.

In some aspects the present invention relates to a blower-filtration unit for a powered air purifying respirator (PAPR) comprising a motor, a magnetic field sensor; and a controller comprising a constant flow function, wherein the controller executes the constant flow function upon detection of a magnetic field strength that exceeds a reference threshold magnetic field strength.

According to other aspects, the present invention relates to a method of maintaining airflow in a powered air-purifying respirator (PAPR) comprising, providing a PAPR comprising a motor, a magnetic field sensor, and a controller, the controller comprising a constant flow function and a calibrated flow function; storing a reference threshold magnetic field strength in the controller; reading a motor speed necessary to generate a compliant air flow in an ambient magnetic field environment and storing the motor speed as a reference motor speed and periodically reading magnetic field strength and comparing the reading to the reference threshold magnetic field strength; wherein the constant flow function is executed in response to a magnetic field strength reading that exceeds the reference threshold magnetic field strength and the calibrated flow function is executed in response to a magnetic field strength reading that falls below the reference threshold magnetic field strength.

According to yet other aspects, the present invention relates to a method of maintaining airflow in a powered air-purifying respirator (PAPR), the method comprising providing a PAPR with a controller that provides a predetermined reference motor speed for the motor to execute upon detection of a magnetic field strength that exceeds a reference threshold magnetic field strength.

DETAILED DESCRIPTION

As used in this description, the following terms have the meanings as indicated:

"User" is a person who interacts with the PAPR either by wearing and/or making any adjustment to the PAPR.

"Ambient magnetic field strength (ambient MF)" means any magnetic field strength that is below a magnetic field strength that interferes with the function of mechanical and/or electronic equipment. Such magnetic field strength may be the measured strength of an actual magnetic field in an environment or an estimated magnetic field strength value (based on known effects of magnetic fields on mechanical and/or electronic equipment).

"High magnetic field strength" means any magnetic field strength at which the function of mechanical and/or electronic equipment may be impaired due to the influence of the magnetic field.

"Threshold magnetic field" (threshold MF) is a magnetic field strength that defines the boundary between an ambient magnetic field strength and a high magnetic field strength as those terms are used herein.

"Compliant air flow" is a volumetric air flow that is compliant with any and all pertinent regulations related to air flow in respirators.

Powered air-purifying respirators generate filtered airflow to the breathing space of a user by means of a fan that draws in air. The air is directed through one or more filters before it is delivered to the user. The volume of air delivered to the user is an important consideration, with minimal volumetric quantities required to support adequate respiration and comfort of the user. Regulatory bodies promulgate various regulations related to PAPRs and may mandate minimal airflow requirements. Currently, in the United States, NIOSH 42 CFR Part 84 requires loose fitting PAPRs to produce a minimum volumetric air flow of 170 liters per minute (L/min).

Certain factors can affect air flow in a PAPR. For example, as the filter(s) collect contaminants the ease with which air can flow through the filter will be diminished. Thus, higher fan speeds will be required to maintain airflow as filters become loaded or clogged with contaminants. Some PAPRs employ electronics to maintain factory-calibrated airflow at nominal values.

Environmental conditions have also been shown to potentially have a detrimental effect on PAPR performance. A particular challenge is presented when a PAPR is employed in high magnetic field (MF) environments, such as, for example, in the potrooms employed in the smelting process. It has been observed that PAPR airflow rates may slow or even stop when the magnetic field strength reaches certain levels due to the adverse effects of the high magnetic field on the function of the motor. Magnetic fields can disrupt a variety of motors that are typically employed in PAPRs. For example, typical brushless DC motors are susceptible to disruption through interference with hall effect sensors. Likewise, sensorless brushless DC motors can have compromised performance due to the interaction of the external magnetic field with the internal magnetic field of the motor. Brushed motors may be employed with use of magnetic shielding; however, this approach is less desirable because of the limited lifetime of brushed motors. Magnetic fields may also affect PAPR performance by exerting effects on other components of the motor/blower. For example, impellors made of conductive material may be susceptible to disruption via formation of eddy currents.

The particular and extreme conditions presented in smelting operations (e.g., very elevated temperatures) make use of PAPRs desirable. Therefore, a need exists for overcoming the adverse effects of high magnetic fields on PAPR performance.

Figure 1:
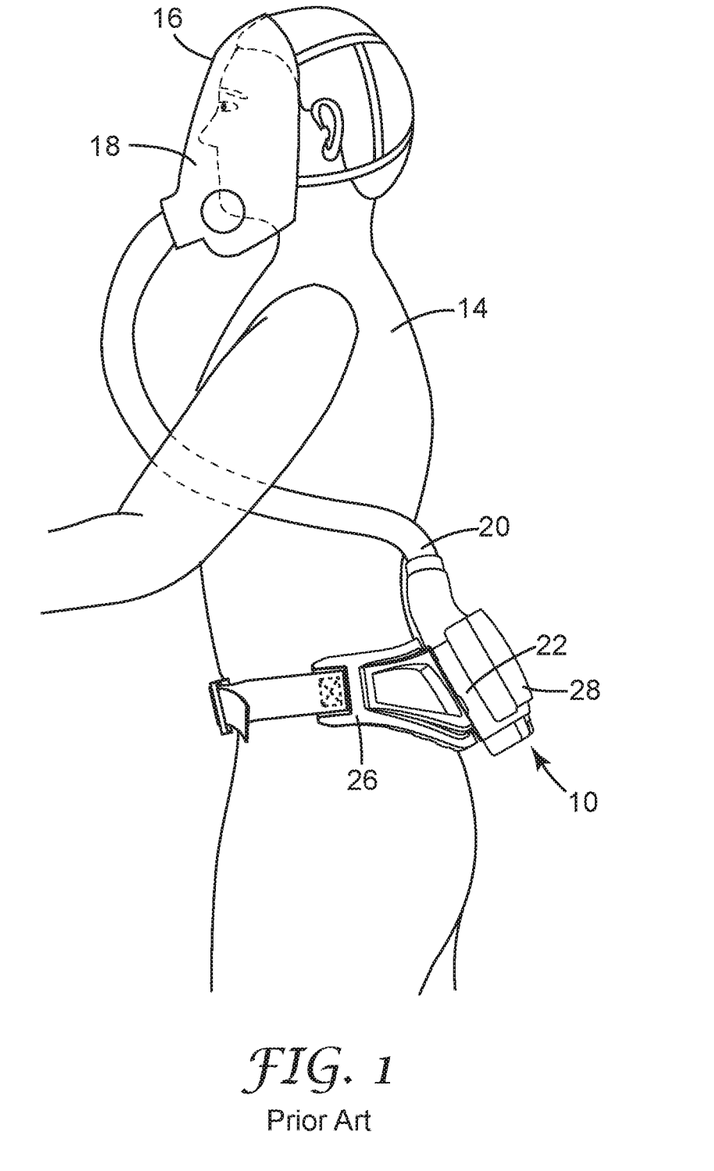
FIG. 1 is a perspective view of a typical PAPR shown being worn by a user.

The present invention is directed to a PAPR appropriate for use in high magnetic field strength environments. FIG. 1 depicts a typical prior art PAPR 10 being worn by a user 14. PAPR 10 comprises breathing head gear 16 shown disposed on the face of the user 14 creating a breathing space 18 in which filtered air is supplied through a breathing tube 20 for the user to inspire and into which the user can exhale. Breathing head gear 16 may be a breathing mask, hood, helmet, hard head-top, or other suitable component having an inlet for filtered air defining a breathing space 18 for the user. PAPR 10 includes a blower/filter unit 22 that is typically attached to the user 14 via a belt 26 secured about the waist of the user 14. Blower/filter unit 22 is designed to be worn by a user in an atmosphere having unwanted respiratory (and potentially other) contaminants.

Figure 2:
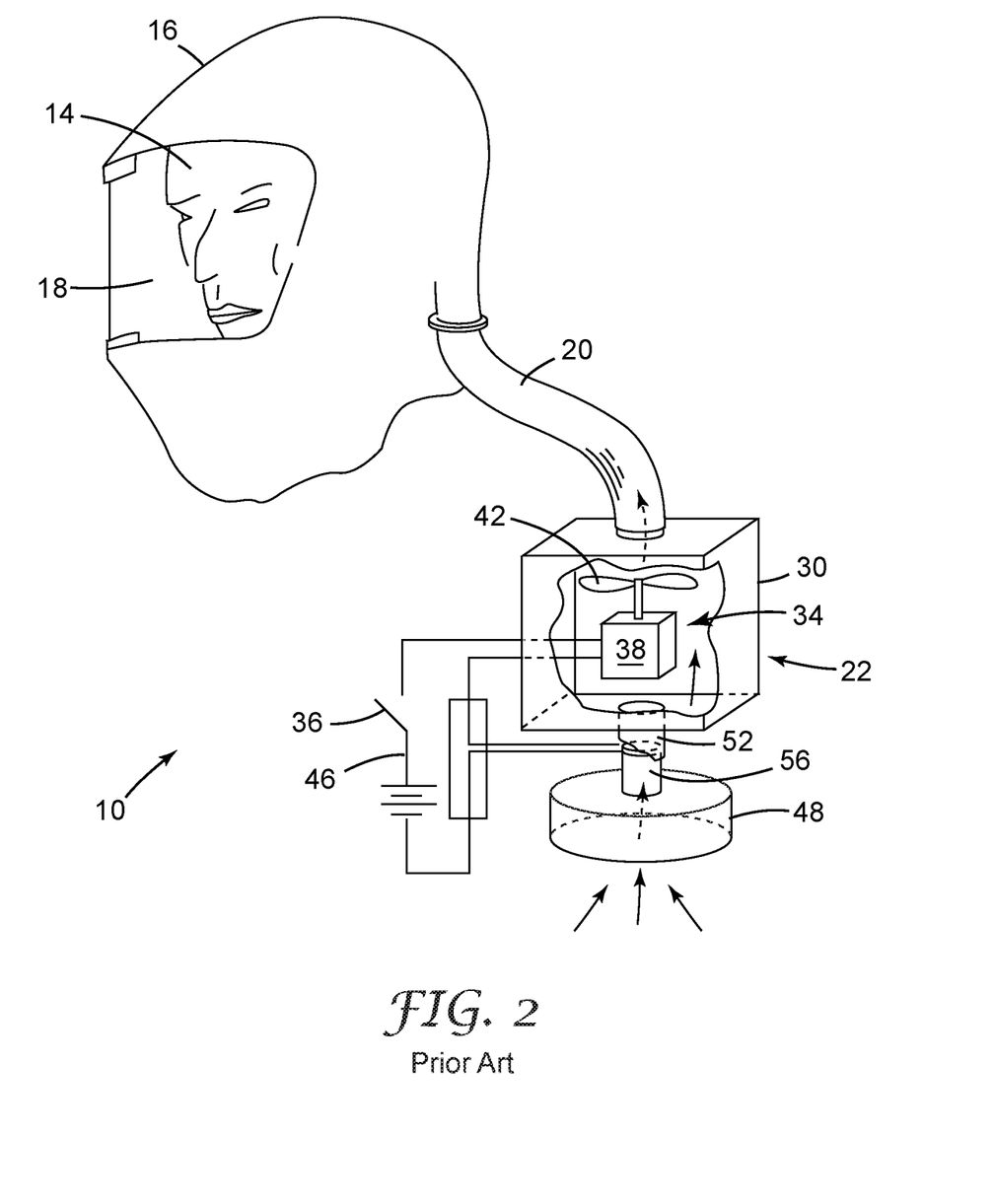
FIG. 2 is a perspective and diagrammatic view of a typical PAPR.

A more detailed view of a typical blower/filter unit 22 is shown in FIG. 2. Blower/filter unit 22 includes a blower housing unit 30 that houses a blower 34. Blower 34 comprises a motor 38 and an impellor 42. Motor 38 is driven by a power source 46 that is typically a battery pack attached to the user (not shown). Blower/filter unit 22 also includes one or more replaceable filter cartridges, canisters, or other filter units 48, a housing fluid (air) inlet 52, and a filter-fluid (air) outlet 56. Blower 34 is used to create negative pressure in a chamber of the blower housing unit 30, which draws air from the ambient environment through one more filter cartridge(s) 48 for removing contaminants from the ambient air prior to delivering it via the breathing tube 20 to the breathing space 18 for the user 14 to inhale. The path of air flow is depicted with arrows in FIG. 2.

Blower housing unit 30 may further include electronics and other components directed to maintaining factory-calibrated air flow. Such components include flow control algorithms and motor modulators to control the speed of the motor (not shown).

Figure 3:
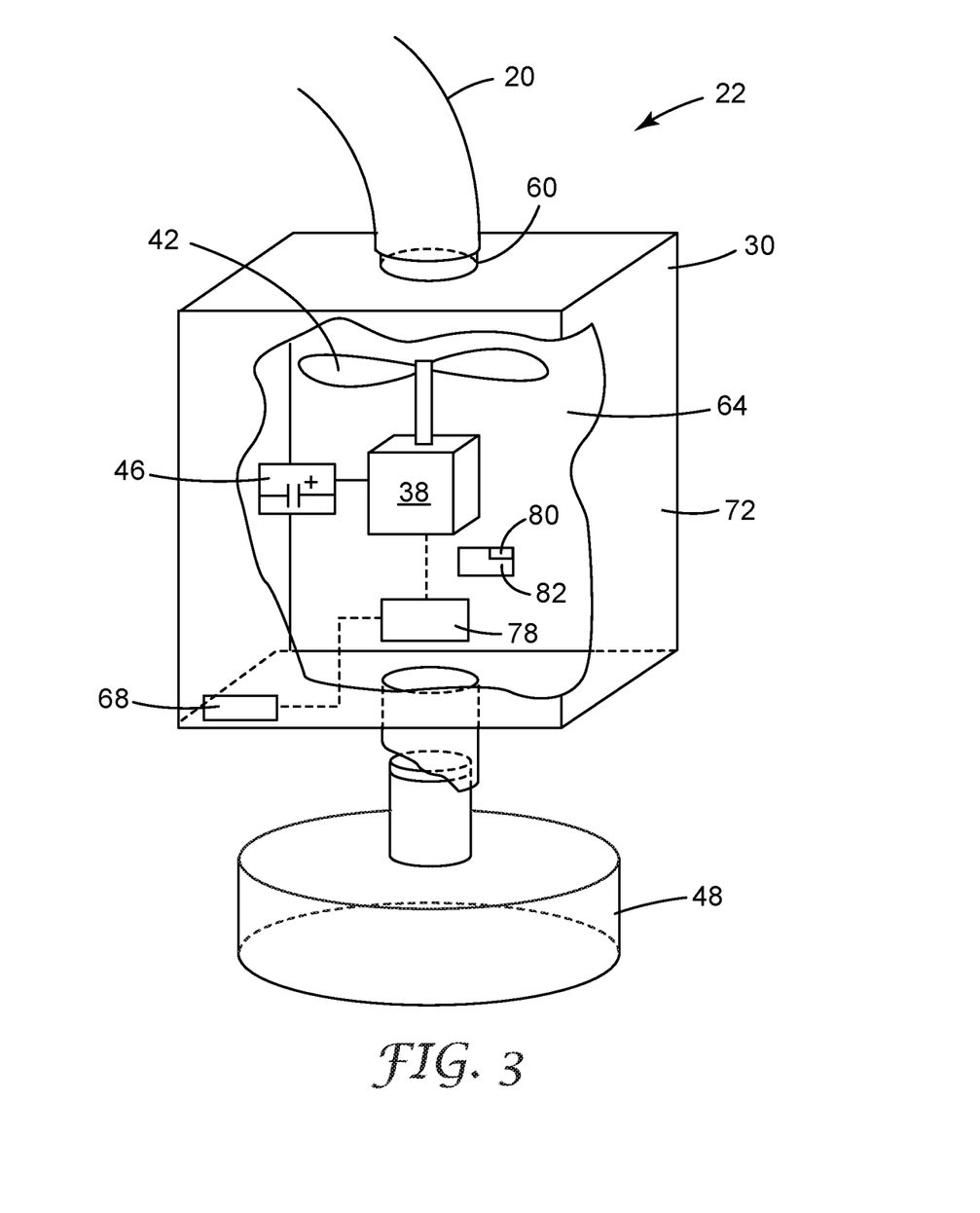
FIG. 3 is a perspective view of an embodiment of a blower-filtration unit for a PAPR.

FIG. 3 depicts an embodiment of the blower/filter unit 22 of the present invention. Blower/filter unit 22 includes a blower housing unit 30 that contains a motor 38. Motor may be a brushed motor or brushless motor. The motor may be sensored (hall effect sensors) or sensorless. In one embodiment, the motor 38 comprises a brushless direct current (DC) motor (BLDC). Motor 38 drives an impellor 42, which creates negative pressure within a cavity 64 of the blower/filter unit 22 to pull air from the ambient environment through one or more filter cartridges 48. Filtered air is then driven through a breathing tube 20 that is fluidly coupled to the blower/filter unit 22 via a housing fluid (air) outlet 60. Filtered air is then delivered to the breathing space of the breathing head gear (not shown).

According to one embodiment, blower/filter unit 22 includes a magnetic field sensor (MF sensor) 68 for detecting magnetic field strength, such as, for example, a magnetometer. MF sensor 68 may be provided within the blower housing unit 30. Alternatively, MF sensor 68 may be provided on an external surface 72 of the blower housing unit 30. MF sensor 68 may be placed at any location so long as it is able to detect the magnetic field strength of the environment in which the user is located. For example, MF sensor may be provided separate from blower/filter unit 22 and attached to the person of the user, for example, on clothing, PAPR belt, or breathing head gear. Any MF sensor suitable for detecting magnetic field strength may be employed.

In some embodiment magnetic field sensor 68 is a magnetometer. Magnetometer 68 may a scalar magnetometer, alternatively magnetometer may be vector magnetometer. In some embodiments, magnetometer 68 is a three-axis magnetometer. Magnetometers are well known in the art and may be configured in a variety of manners suitable for use in the present inventive PAPR.

Magnetic field sensor 68 is operatively coupled to an electronic process controller 78, (detailed in FIG. 4) which may comprise various circuitry, memory, software, and the like. Electronic process controller 78 may comprise functions for controlling air flow (air flow control function) to the breathing space of the breathing head gear (not shown in FIG. 3). In some embodiments, electronic process controller 78 comprises air flow control circuitry (not shown) for executing at least two air flow control functions; a constant flow function and a calibrated flow function. The constant flow function maintains a constant air flow by maintaining the motor at a certain predetermined speed (revolution per minute RPM). The calibrated flow function controls motor speed according to predetermined calibration parameters, in which motor speed may fluctuate dependent upon certain signals received by the electronic process controller. Such calibrated flow functions are known to those of skill in the art. Electronic process controller 78 operates responsive, in part, to input by MF sensor 68. Electronic process controller 78 determines which of the least two air flow control functions to execute based on input from MF sensor (discussed in greater detail below).

In an embodiment, such air flow control circuitry may operate by employing a motor controller 82. Motor controller 82 is thus operatively coupled to electronic process controller 78. In an embodiment, electronic process controller 78 is configured to send input to motor controller 82 and also to receive input from motor controller 82. Motor controller 82 is configured to relay a motor speed signal to the electronic process controller, which is configured to receive, and in some embodiments, to store such input data. Motor controller 82 may include a motor speed sensor 80. Motor speed sensor may be contained within motor controller (as shown in FIG. 3). Alternatively, motor speed sensor 80 may be independent of motor controller in which case it would be operatively coupled to the electronic process controller 78 either directly or through the motor controller 82. Other signals may also be generated and relayed by the motor controller 82.

Electronic process controller 78 is configured to relay a motor voltage signal to the motor controller, which is configured to receive such a signal. Motor controller 82 is responsive to motor voltage signals generated by the electronic process controller 78 and modulates the motor speed in accordance with such signals. Electronic process controller 78 may generate and relay other signals to the motor controller 82.

Motor controller 82 is operatively coupled to motor 38, which is configured to receive and respond to input signals from motor controller 82. Such signals may include motor voltage signals to control the speed of the motor. Motor 38 may be capable of receiving and responding to various other input signals as well.

Figure 4:
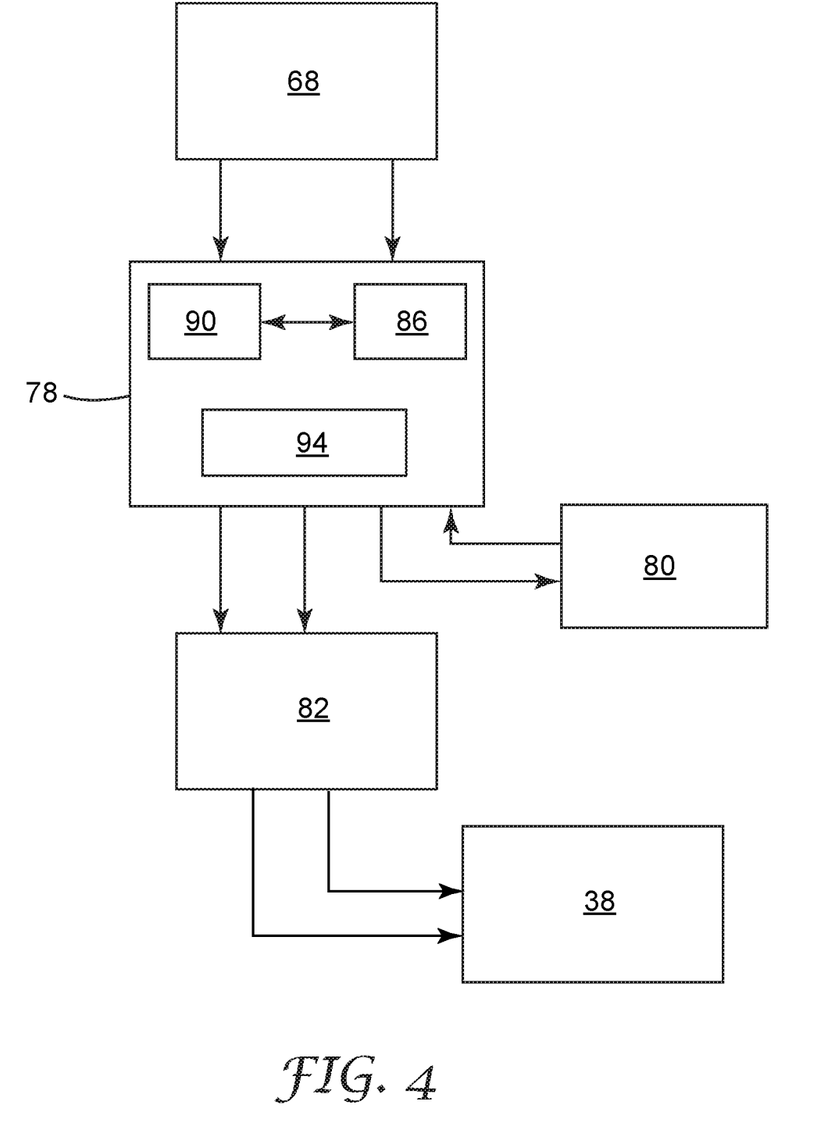
FIG. 4 is a control schematic of the system of FIG. 3 according to an embodiment of the invention.

FIG. 4 is a control schematic of an embodiment of the PAPR 10 of the present invention. In one embodiment, an electronic process controller 78 is operatively coupled to a motor 38 via a motor controller 82. Motor controller 82 includes a function that controls the speed of the motor 38 and hence the volume of air delivered to the breathing space 18 (not shown). The speed of the motor is determined by the electronic process controller 78 according to computations made by electronic process controller 78, which, in turn, are based on inputs received from MF sensor 68. Inputs from MF sensor 68 are compared to a reference threshold magnetic field that is stored within memory 86 by a comparator 90. Electronic process controller 78 selects an appropriate air flow (motor speed) control function 94 based on result of the comparison made by the comparator 90 and relays signals appropriate to control motor speed (for example voltage signals) to the motor 38. As will be detailed below, certain air flow functions are based on readings made by motor speed sensor 80 that are relayed to and stored by electronic process controller 78.

The method of air flow control will now be described with reference to FIG. 5, which illustrates a flow chart of the operation of an embodiment of the PAPR of the present invention. The operation of the PAPR 10 will be described in the context of a smelting operation, during which magnetic fields strong enough to negatively affect PAPRs may be generated. It will be appreciated that such operation description is for illustrative purposes only and PAPR 10 may be used in other operations (including those in which normal magnetic field strengths are expected). Likewise, any time intervals, values, etc. described are illustrative only and can be modified without departing from the scope of the current invention.

Industrial production of aluminum is typically carried out by an electrolytic process in production plants (smelters). Electrolysis cells are arranged in a series to form a cell line (potline) within a potroom. Currents passed through the cells may be as high as 600,000 amperes, which generates magnetic field strengths well above ambient magnetic field strengths. As used herein, ambient magnetic field strength (AMF) means any magnetic field strength(s) that does not pose significant risks to the operation of electronic and/or mechanical devices. Some motors can be affected by magnetic fields strengths as low as 5 mT. Magnetic field strengths in the vicinity of the potlines have been reported to be as high as 50 mT. Magnetic fields of these magnitudes could render PAPRs inoperable by slowing or even stopping air flow due to the tendency of such magnetic field strengths to slow or stop motors.

The present PAPR and method can circumvent adverse effects of high magnetic field strengths on PAPR function. In employing certain embodiments of the present PAPR and methods of the present invention, a user, while in an ambient magnetic field (such as designated rest areas or other areas of smelter in which effects of the magnetic fields produced by cells is negligible) initiates (turns on) the PAPR 10, i.e., initiates electronic process controller 78 and any software, circuitry, functions, etc. that it may contain.

Upon initiation, PAPR 10 commences a start-up procedure. Initiation of PAPR 10 also signals motor 38 to run at speeds sufficient to produce compliant air flow to the breathing space 18 at least as high as those required by pertinent regulatory requirements, e.g., 170 L/min in accordance with current NIOSH regulations. Upon initiation, PAPR 10 may execute any factory-set flow control function, such as a calibrated flow function (described in detail below) to achieve compliant volumetric airflow. Regardless of the flow control that is run, it must reach and maintain a volumetric airflow that is at least equivalent to those required by pertinent regulations.

In some embodiments, after a specific time interval (start-up delay interval), the MF sensor 68 executes and measures the ambient field strength and stores such value in a memory portion of the electronic process controller 78 as a threshold magnetic field strength (TMF). The start-up delay time interval may be a factory pre-set value. In some embodiments, as depicted in FIG. 5, the start-up delay time interval is about two minutes. In other embodiments, a different time interval may be selected. It will be appreciated that any suitable time interval may be selected. In some embodiments, the interval may be selected by a user from a set of pre-programmed time intervals or be completely customizable, allowing user to enter their desired time interval. In other embodiments, the sensor may be initiated manually by a user. In some embodiments, the start-up delay time interval ranges from about 5 ms to about 10 minutes. In the embodiment depicted in FIG. 5, the start-up delay time interval is about 2 minutes. As will be appreciated, in embodiments employing a factory pre-set, pre-set may comprise a single value or number of values selectable by a user through a user interface (not shown).

In other embodiments, the reference threshold magnetic field strength may be provided as a factory pre-set value or manually selected and entered into the PAPR 10 by a user. In these embodiments it would be unnecessary to obtain an initial magnetic field reading while the PAPR 10 is in an ambient magnetic field. Regardless of the method by which the reference threshold magnetic field strength is obtained (read by sensor, factory pre-set, or user entered), it should correspond to a magnetic field strength that is lower than those magnetic field strengths known to impair PAPR motor function.

Start-up procedure further includes collection of the current motor speed. Such motor speed is stored in memory as a reference motor speed (RMS). As will be appreciated, when PAPR 10 is initiated it executes flow control necessary to generate compliant air flow. Thus, since start-up procedure is executed while the PAPR 10 is in an ambient magnetic field, the reference motor speed is the speed that is necessary to generate compliant airflow at the filter's current load/clogging level. In all embodiments, the reference motor speed is the motor speed necessary to generate airflow to breathing space adequate to comply with pertinent regulatory standards. Thus, for embodiments in which the reference threshold magnetic field strength is pre-set or user selected, it will be necessary to run PAPR 10 in ambient magnetic field prior to entering the high magnetic field area to obtain the reference motor speed.

Once PAPR 10 has completed the start-up procedure, an airflow control procedure commences. During airflow control procedure, MF sensor 68 is initiated after a magnetic field reading interval. In some embodiments, MF reading time interval is a factory pre-set value. In other embodiments user may select and enter a desired time interval. In still other embodiments, user selects from multiple interval durations that are factory pre-set. The MF reading time interval, whether factory pre-set or user selected should be of suitable duration taking into consideration that the user's activities and locations are quickly changing.

In some embodiments, the MF sensor time interval ranges from about 10 ms to about 30 seconds. In the embodiment depicted in FIG. 5, the time interval is about 10 ms. Thus, the MF sensor 68 will take a new magnetic field strength reading and relay it to the electronic process controller 78 every 10 ms. During airflow control procedure, PAPR 10 is, in effect, continuously sensing the magnetic field strength.

As described with respect to FIG. 3, electronic process controller 78 includes circuitry, software, functionality, and/or the like to control airflow. In one embodiment, electronic process controller comprises at least two air control functions; a calibrated flow function and a constant flow function. As depicted in FIG. 5, the PAPR 10 continuously executes the airflow control procedure to select an appropriate air flow control function dependent upon results of the comparison of the MF reading to the threshold magnetic field.

In some embodiments, once MF reading is taken and relayed to electronic process controller 78, comparator 90 compares the reading to the stored reference threshold magnetic field to determine whether the current magnetic field strength (the MF reading) is above or below the reference threshold magnetic field strength.

Figure 5:
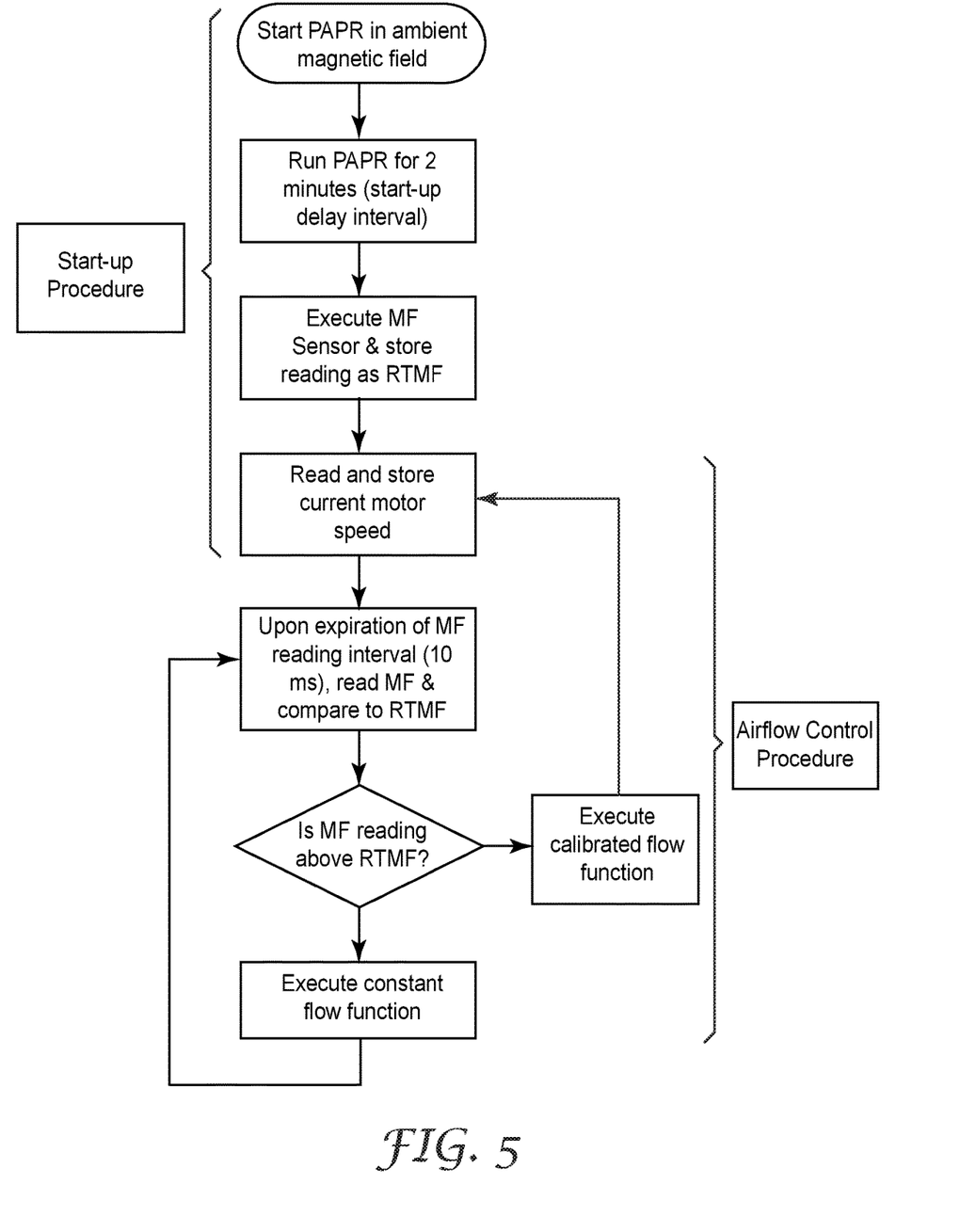
FIG. 5 is a flow chart of the system of FIG. 4.

As depicted in FIG. 5, if the magnetic field reading is above the reference threshold magnetic field strength, the PAPR 10 executes the constant flow control function and continues to monitor and compare the magnetic field strength conditions at the magnetic field reading interval. PAPR 10 will maintain constant air flow function until magnetic field reading reaches or falls below the reference threshold magnetic field.

When comparator 90 determines that the magnetic field reading is at or below the reference threshold magnetic field, a calibrated flow function is executed. As can be seen from FIG. 5, down this path, the PAPR 10 will also read and store the current motor speed to obtain an updated reference motor speed to replace the previously stored reference motor speed. PAPR 10 will continuously execute air flow control procedure, acquiring and comparing magnetic field strength readings to the reference threshold magnetic field strength at the magnetic field reading interval (10 ms in the embodiment depicted in FIG. 5). PAPR 10 will maintain calibrated air flow function so long as the magnetic field reading falls below the reference threshold magnetic field strength.

Calibrated flow functions are known in the art and are typically employed in PAPRs to maintain factory calibrated airflow. Calibrated flow functions are able to maintain constant and consistent airflow to the breathing space despite varying levels of filter load/clogging, breathing tube pressure drop and head gear pressure drop. For example, calibration parameters are employed to modulate motor speed to compensate for decreased airflow that results from the filter becoming filled and clogged with the contaminants filtered out of the ambient air. Calibrated flow functions are suitable for use in ambient magnetic fields, where motor speed will not be affected.

The constant flow function of the present invention, also maintains constant and consistent airflow but does so, however, by maintaining the motor speed at the stored reference motor speed until the level of filter load/clogging requires a higher motor speed to generate compliant air flow. The PAPR and methods of the present invention ensure compliant airflow in high magnetic field area by periodically reading the motor speed required to achieve compliant airflow in an ambient magnetic field and updating the reference motor speed for the constant flow function to execute.

Advantageously, the present invention provides for updating the constant flow function. Each time MF sensor 68 executes a magnetic field strength reading a comparator 90 compares the reading to the stored reference magnetic field strength and when the magnetic field strength falls at or below the threshold, the electronic process controller 78 signals for a new motor speed reading and replaces the previous reference motor speed (stored in memory) with the new motor speed, which will have been adjusted for changes (if necessary) due to filter clogging/loading. Periodically updating the reference motor speed according to embodiments of the present invention advantageously ensures that an adequate volume of air is reaching the user regardless of filter load.

As will be appreciated other capabilities may be added to the PAPR 10 without departing from the scope of the present disclosure. For example, additional programming, e.g. hysteresis functions may be included. Likewise, PAPR 10 may include additional components such as air quality monitors. PAPR may also include user interface(s) and/or display screens to display any or all of the parameters already discussed.

The present invention has now been described with reference to several embodiments thereof. The foregoing detailed description and examples have been given for clarity of understanding only. No unnecessary limitations are to be understood therefrom. It will be apparent to those skilled in the art that many changes can be made in the embodiments described without departing from the scope of the invention. Thus, the scope of the present invention should not be limited to the exact details and structures described herein, but rather by the structures described by the language of the claims, and the equivalents of those structures.

What is claimed is:

1. A blower-filtration unit for a powered air purifying respirator (PAPR) suitable for use in high magnetic field strength environments comprising:
   a motor comprising a motor speed sensor;
   a magnetic field sensor arranged and placed to be capable of detecting a magnetic field strength in an ambient environment in which a user is located; and
   a controller operatively coupled to the motor, the motor speed sensor, and the magnetic field sensor and comprising a memory as well as a constant flow function and a calibrated flow function, wherein the controller is configured to execute the constant flow function upon detection of a magnetic field strength that exceeds a reference threshold magnetic field strength, the reference threshold magnetic field strength being a value that is lower than values of magnetic field strength known to impair motor function, wherein the controller is configured to execute the calibrated flow function when the measured magnetic field strength is below or drops below the reference threshold magnetic field strength, and wherein the blower-filtration unit or the controller is adapted to perform in the powered air purifying respirator.

2. The blower-filtration unit of claim 1, wherein the reference threshold magnetic field strength is a measured ambient magnetic field strength that is configured to be measured and stored during a start-up procedure.

3. The blower-filtration unit of claim 1, wherein the reference threshold magnetic field is a magnetic field strength value selected from a range of ambient magnetic field strengths which would not interfere with a function of mechanical and/or electronic equipment.

4. The blower-filtration unit of claim 1, wherein the constant flow function maintains a speed of the motor at a motor speed necessary to provide at least 170 L/min of airflow to an air mask when the blower-filtration unit is coupled to the air mask.

5. The blower-filtration unit of claim 1, wherein the magnetic field sensor is a magnetometer adapted to detect the magnetic field strength at a predetermined time interval to obtain a measured magnetic field strength.

6. The blower-filtration unit of claim 1, wherein the controller executes the calibrated flow function when the detected magnetic field strength drops below the reference threshold magnetic field strength.

7. The blower-filtration unit of claim 1, further comprising a housing, wherein the housing comprises an air outlet fluidly coupled to an air conduit, the air conduit fluidly coupled to an air mask.

8. The blower-filtration unit of claim 1, wherein the reference threshold magnetic strength is configured to be provided as a factory pre-set value.

9. A method of maintaining airflow in a powered air-purifying respirator (PAPR) in high magnetic field strength environments comprising:
    performing a start-up procedure with the powered air-purifying respirator in an ambient magnetic field environment where an ambient magnetic field strength in the ambient magnetic field environment is below a magnetic field strength that would interfere with a function of mechanical and electronic equipment,
    the start-up procedure comprising:
        executing, via a controller of a blower-filtration unit, a calibrated flow function provided in the controller to generate a compliant air flow;
        reading, via the controller responsive to input from a motor speed sensor of a motor of the blower-filtration unit, a motor speed and storing the motor speed as a reference motor speed;
    the method further comprising:
        storing a reference threshold magnetic field strength in the controller, the reference threshold magnetic field strength being a value that is lower than values of magnetic field strength known to impair motor function;
        an airflow control procedure to be performed in the high strength magnetic field environments,
        the airflow control procedure comprising:
        periodically reading, via the controller responsive to input from a magnetic field sensor that is arranged and placed to detect the ambient magnetic field strength in the ambient magnetic field environment, the ambient magnetic field strength and comparing the reading to the reference threshold magnetic field strength;
        responsive to an ambient magnetic field strength reading that falls below the reference threshold magnetic field strength, executing via the controller the calibrated flow function; and
        responsive to an ambient magnetic field strength reading that exceeds the reference threshold magnetic field strength, executing a constant flow function provided in the controller, where a current speed of the motor is controlled to be maintained at the reference motor speed.

10. The method of claim 9, wherein the reference threshold magnetic field strength is obtained by reading and storing the ambient magnetic field strength during the start-up procedure while the PAPR is in the ambient magnetic field environment.

11. The method of claim 9, wherein the reference threshold magnetic strength is a value within ambient magnetic field ranges selected and entered by a user, the ambient magnetic field ranges selected and entered by the user being values which would not interfere with a function of mechanical and electronic equipment.

12. The method of claim 9, further comprising reading the ambient magnetic field strength at a predetermined time interval subsequent to the storing of the reference threshold magnetic field strength.

13. The method of claim 9, wherein the airflow control procedure further comprises: responsive to the ambient magnetic field strength reading at or below the threshold reference magnetic field strength, obtaining via the controller a new motor speed reading and replacing the reference motor speed with the new motor speed reading such that the new motor speed reading becomes the reference motor speed.

14. The method claim 9, wherein the ambient magnetic field strength is read and compared to the reference threshold ambient magnetic field strength at a predetermined time interval.

15. The method of claim 9, wherein the constant flow function and calibrated flow function maintain airflow at a flow rate of at least 100 L/min.

* * * * *

UNITED STATES PATENT AND TRADEMARK OFFICE
CERTIFICATE OF CORRECTION

| | |
|---|---|
| PATENT NO. | : 12,208,291 B2 |
| APPLICATION NO. | : 17/309368 |
| DATED | : January 28, 2025 |
| INVENTOR(S) | : Keith Kevin McLaughlin |

Page 1 of 1

It is certified that error appears in the above-identified patent and that said Letters Patent is hereby corrected as shown below:

In the Claims

<u>Column 9</u>
Line 14, In Claim 8, delete "magnetic strength" and insert -- magnetic field strength --, therefor <u>Column 10</u>
Line 20, In Claim 11, delete "magnetic strength" and insert -- magnetic field strength --, therefor Signed and Sealed this
Fifteenth Day of July, 2025

Coke Morgan Stewart
*Acting Director of the United States Patent and Trademark Office*